US008396417B2

(12) United States Patent
Rofougaran

(10) Patent No.: US 8,396,417 B2
(45) Date of Patent: Mar. 12, 2013

(54) FREQUENCY SHIFTING REPEATER

(75) Inventor: Ahmadreza Rofougaran, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/339,966

(22) Filed: Dec. 29, 2011

(65) Prior Publication Data

US 2012/0156989 A1 Jun. 21, 2012

Related U.S. Application Data

(63) Continuation of application No. 12/348,798, filed on Jan. 5, 2009, now Pat. No. 8,090,315.

(60) Provisional application No. 61/140,714, filed on Dec. 24, 2008.

(51) Int. Cl.
*H04B 7/15* (2006.01)
(52) U.S. Cl. ...................... 455/11.1; 455/146
(58) Field of Classification Search ............. 455/209, 455/13.1, 11.1, 7, 137–141
See application file for complete search history.

(56) References Cited

U.S. PATENT DOCUMENTS 6,697,603 B1 * 2/2004 Lovinggood et al. ........ 455/13.1
2008/0096508 A1 * 4/2008 Luff ............................. 455/209

* cited by examiner

*Primary Examiner* — Tu X Nguyen
(74) *Attorney, Agent, or Firm* — Farjami & Farjami LLP

(57) ABSTRACT

Aspects of a method and system for frequency control in a frequency shifting repeater are provided. In this regard, a reference frequency may be divided to generate a first pair of local oscillator (LO) signals, the first pair of LO signals may be divided to generate a second pair of LO signals. The two pairs of LO signals may be utilized to frequency shift a received signal for repeating the signal on a different frequency. The frequency shifted signal may be generated by down-converting the received signal utilizing the first pair of LO signals, up-converting the down-converted signal utilizing the second pair of LO signals, and combining the resulting up-converted signals. The reference frequency may be divided by a first scaling factor to generate the first pair of LO signal which, in turn, may be divided by a second scaling factor to generate the second pair of LO signals.

20 Claims, 4 Drawing Sheets

FREQUENCY SHIFTING REPEATER

This is a continuation of application Ser. No. 12/348,798 filed Jan. 5, 2009 now U.S. Pat. No. 8,090,315.

CROSS-REFERENCE TO RELATED APPLICATIONS/INCORPORATION BY REFERENCE

This patent application makes reference to, claims priority to and claims benefit from U.S. Provisional Patent Application Ser. No. 61/140,714 filed on Dec. 24, 2008.

The above stated application is hereby incorporated herein by reference in its entirety.

FIELD OF THE INVENTION

Certain embodiments of the invention relate to signal processing. More specifically, certain embodiments of the invention relate to a method and system for frequency control in a frequency shifting repeater.

BACKGROUND OF THE INVENTION

As the number of wireless devices and wireless standards continue to grow, wireless communications are increasingly being relied upon to exchange information. For example, Bluetooth, Wi-Fi, and cellular communications (e.g., GSM) are just a few examples of well established wireless communications commonly utilized in today's technology driven societies.

In this regard, although different wireless networks may have widely varying characteristics, a common element in many wireless communication networks is a signal repeater. In this regard, a repeater may receive a wireless signal and re-transmit that signal at a higher power than that which was received. In this manner, repeaters may enable extending the range of a wireless network. Conventional repeaters, however, may be too expensive and/or limited in performance to be useful in many wireless communication networks.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for frequency control in a frequency shifting repeater, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for frequency control in a frequency shifting repeater. In various embodiments of the invention, a reference frequency may be frequency divided to generate a first pair of local oscillator (LO) signals, the first pair of LO signals may be divided to generate a second pair of LO signals, and the two pairs of LO signals may be utilized to frequency shift a received signal such that the signal may be repeated or retransmitted on a different frequency. The frequency shifted signal may be generated by down-converting the received signal utilizing the first pair of LO signals, up-converting the down-converted signal utilizing the second pair of local oscillator signals, and combining the resulting up-converted signals. The reference frequency may be recovered from the received signal. The reference frequency may be divided by a first scaling factor to generate the first pair of LO signals. The first pair of LO signals may be divided by a second scaling factor to generate the second pair of LO signals. The two scaling factors may be controlled independently of, or in conjunction with, each other. One or both of the scaling factors may be controlled based on a desired frequency separation between the received signal and the frequency shifted version of the received signal. The polarity of the second pair of LO signals may be adjusted prior to utilizing them to up-convert the down-converted received signal. The down-converted received signals may be generated by mixing the received signal with the first pair of LO signals. The up-converted signals may be generated by mixing the down-converted received signals with the second pair of LO signals.

Figure 1:
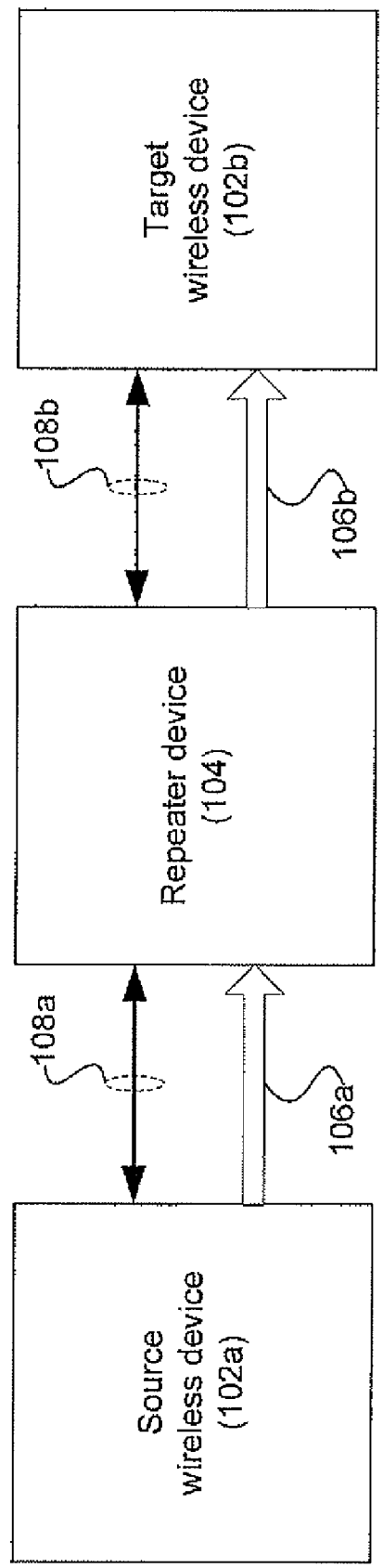
FIG. 1 is a block diagram illustrating a repeater device utilized to forward communications between two wireless devices, in accordance with an embodiment of the invention.

FIG. 1 is a block diagram illustrating a repeater device utilized to forward wireless communications between two wireless devices, in accordance with an embodiment of the invention. Referring to FIG. 1, there is shown a source wireless device 102a, a target wireless device 102b, a repeater device 104, data connections 106a and 106b, and control connections 108a and 108b.

The source wireless device 102a and the target wireless device 102b may each comprise suitable logic, circuitry, and/or code that may enable receiving, transmitting, and processing of RF signals. For example, the source wireless device 102a and the target wireless device 102b may each comprise the communication subsystem 200, substantially as described with respect to FIG. 2.

The repeater device 104 may comprise suitable logic, circuitry, and/or code that may enable reception and/or transmission of RF signals to facilitate forwarding RF signals from the source wireless device 102a to the target wireless device 102b. Additionally, the repeater device 104 may comprise suitable logic, circuitry, and/or code that may enable establishing and/or utilizing control connections 108a and 108b with the source wireless device 102a and/or target wireless device 102b, respectively.

The connections 106a and 106b may each comprise a radio frequency (RF) and/or wireless link that may enable high speed data communications. For example, the connections 106a and 106b may be point-to-point connections operation at or near the 61 GHz to 61.5 GHZ ISM band. The control connections 108a and 108b may each comprise a radio frequency (RF) and/or wireless link that may be based on a wireless protocol such as Bluetooth, which may be utilized to communicate control messages between the source wireless device 102a and the repeater device 104, and between the repeater device 104 and the target device 102b, respectively.

In operation, the repeater device 104 may enable forwarding RF signals transmitted from the source wireless device 102a via the connection 106a, to the target wireless device 102b via the connection 106b. For example, extremely high frequency (EHF) communications), such as the ISM band near 60 GHz, may generally have limited range, typically operating only in "line-of-sight" settings. Consequently, it may be desirable to utilize other devices, for example, repeater devices such as the repeater device 104, to extend the range of and/or redirect signals communicated between wireless devices.

While it may be desirable to utilize the repeater device 104 in forwarding RF signals between the source wireless device 102a and the target wireless device 102b; mechanisms that prevent and/or reduce interference between receive and transmit RF signals at the repeater device 104 may be necessary. Accordingly, aspects of the invention may enable repeating (retransmitting) a signal at a different frequency than the frequency at which the signal was received. In this regard, the target device 102b may receive at a different frequency than the source device 102a may transmit. In this manner, exemplary embodiments of the invention may select a target device based on a frequency shift applied to a repeated signal. For example, a plurality of target devices 102b may be present and may each receive signals on a different frequency. Additionally, a frequency shift applied to the repeated signal may be determined based on the environment in which the devices 102 and repeater 104 are operating. For example, in instances that certain frequencies may be congested and/or noisy, a frequency shift, which may avoid those frequencies, may be utilized.

Figure 2:
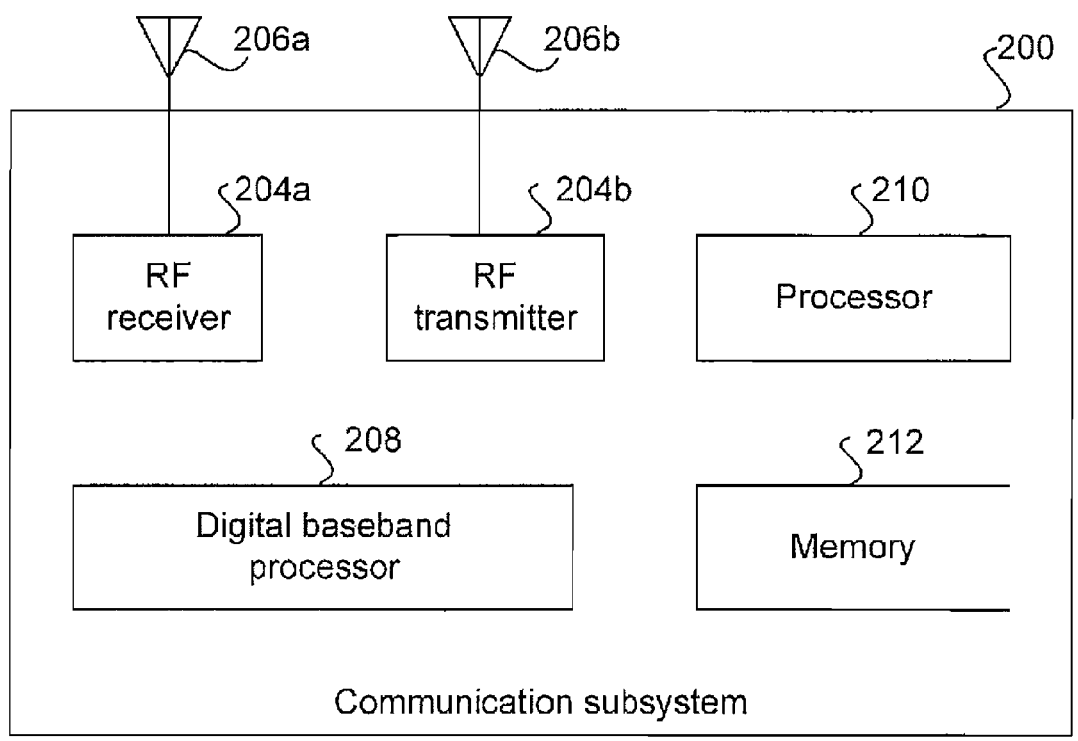
FIG. 2 is a block diagram illustrating an exemplary communication subsystem that utilizes frequency control in a frequency shifting repeater, in accordance with an embodiment of the invention.

FIG. 2 is a block diagram illustrating an exemplary communication subsystem, which may be utilized in accordance with an embodiment of the invention. Referring to FIG. 2, there is shown a communication subsystem 200 comprising an RF receiver 204a, an RF transmitter 204b, a receive antenna 206a, a transmit antenna 206b, a digital baseband processor 208, a processor 210, and a memory 212.

The communication subsystem 200 may comprise the RF receiver 204a, the RF transmitter 204b, the receive antenna 206a, the transmit antenna 206b, the digital baseband processor 208, the processor 210, the memory 212, and may also comprise additional suitable logic, circuitry, and/or code that may enable receiving, transmitting, and processing of RF signals. For example, the communication subsystem 200 may be integrated or located within a wireless device to enable operations in a wireless system, such as the cellular network and/or digital video broadcast network.

The receive antenna 206a may comprise suitable logic, circuitry, and/or code that may enable reception of RF signals. The receive antenna 206a may be communicatively coupled to the RF receiver 204a. The RF receiver 204a may comprise suitable logic, circuitry, and/or code that may enable processing of received RF signals. The RE receiver 204a may down-convert received RF signals to a baseband frequency signal. The RF receiver 204a may perform direct down-conversion of the received RF signals to a baseband frequency signal, for example. In some instances, the RF receiver 204a may enable analog-to-digital conversion of the baseband signal components before transferring the components to the digital baseband processor 208. In other instances, the RF receiver 204a may transfer the baseband signal components in analog form.

In various embodiments of the invention, the RF receiver 204a may enable receiving extremely high frequency (EHF) signals at, for example, approximately 60 GHz. In this regard, the RF receiver 204a may be enabled to generate signals, such as local oscillator signals, for the reception and processing of EHF signals. In various embodiments of the invention, the receive antenna 206a and the RF receiver 204a may enable reception of non-EHF RF signals. For example, the receive antenna 206a and the RF receiver 204a may enable receiving and/or processing of Bluetooth RF signals.

The transmit antenna 206b may comprise suitable logic, circuitry, and/or code that may enable transmission of RE signals; the transmit antenna 206b may be communicatively coupled to the RF transmitter 204b. The RF transmitter 204b may comprise suitable logic, circuitry, and/or code that may enable processing of RF signals for transmission. The RF transmitter 204b may up-convert the baseband frequency signal to an RF signal. The RF transmitter 204b may perform direct up-conversion of the baseband frequency signal to a RF signal. In some instances, the RF transmitter 204b may enable digital-to-analog conversion of the baseband signal components received from the digital baseband processor 208 before up conversion. In other instances, the RF transmitter 204b may receive baseband signal components in analog form. In various embodiments of the invention, the RF transmitter 204b may enable transmission of extremely high frequency (EHF) signals at, for example, approximately 60 GHz. In this regard, the RF transmitter 204b may be enabled to generate signals, such as local oscillator signals, for the transmission and processing of EHF signals. In various embodiments of the invention, the transmit antenna 206b and the RE transmitter 204b may enable transmission of non-EHF RF signals. For example, the transmit antenna 206b and the RF transmitter 204b may enable transmitting and/or processing of Bluetooth RF signals.

The digital baseband processor 208 may comprise suitable logic, circuitry, and/or code that may enable processing and/or handling of baseband frequency signals. In this regard, the digital baseband processor 208 may process or handle signals received from the RF receiver 204a and/or signals to be transferred to the RF transmitter 204b. The digital baseband processor 208 may also provide control and/or feedback information to the RE receiver 204a and to the RF transmitter 204b based on information from the processed signals. The digital baseband processor 208 may communicate information and/or data from the processed signals to the processor 210 and/or to the memory 212. Moreover, the digital baseband processor 208 may receive information from the processor 210 and/or to the memory 212, which may be processed and transferred to the RF transmitter 204b for transmission to the network.

The processor 210 may comprise suitable logic, circuitry, and/or code that may enable control and/or data processing operations for the communication subsystem 200. The processor 210 may be utilized to control at least a portion of the RF receiver 204a, the RF transmitter 204b, the digital baseband processor 208, and/or the memory 212. In this regard, the processor 210 may generate at least one signal for controlling operations within the communication subsystem 200. The processor 210 may also enable executing of applications that may be utilized by the communication subsystem 200. For example, the processor 210 may execute applications that may enable displaying and/or interacting with content received via RF signals in the communication subsystem 200.

The memory 212 may comprise suitable logic, circuitry, and/or code that may enable storage of data and/or other information utilized by the communication subsystem 200.

For example, the memory 212 may be utilized for storing processed data generated by the digital baseband processor 208 and/or the processor 210. The memory 212 may also be utilized to store information, such as configuration information, that may be utilized to control the operation of at least one block in the communication subsystem 200. For example, the memory 212 may comprise information necessary to configure the RF receiver 204a to enable receiving signals in the appropriate frequency band.

In operation, the communication subsystem 200 may enable communication via one or more RF interfaces. The communication subsystem 200 may be integrated within a wireless device to enable wireless communications. For example, the communication subsystem 200 may receive RF signals via the receive antenna 206a; wherein the RF receiver 204a may enable initial processing of the received signal. The communication subsystem 200 may transmit RF signals operating via the RF transmitter 204b and the transmit antenna 206b. The digital baseband processor 208, the processor 210, and the memory 212 may enable performing control and/or related operation during transmission and/or reception of RF signals. For example, the memory 212 may be utilized to store and/or fetch data that may be received and/or transmitted via RF signals. The digital baseband processor 208 may enable performing signal processing operations such as analog-to-digital conversion, encoding/decoding of received and/or transmitted data via the RF signals. The processor 210 may enable controlling of the operations of the communication subsystem 200. For example, the processor 210 may enable controlling the transmit and/or the receive antennas to enable alignment during wireless communications.

In various embodiments of the invention, the communication subsystem 200 may enable EHF communications, which may have limited operational range compared with lower frequency RF interfaces. Accordingly, the communication subsystem 200 may be enabled to utilize other wireless interfaces and/or protocols, For example, the communication subsystem 200 may be enabled to utilize such wireless interfaces such as Bluetooth. The non-EHF interfaces that may be supported in the communication subsystem 200 may be utilized to send information regarding the communication subsystem 200. For example, a Bluetooth connection may be utilized to send information regarding the capability of the communication subsystem 200 and/or to receive messages containing information regarding preferred setting that may be utilized while performing EHF communication.

In various embodiments of the invention, repeater devices may be utilized to extend the range of communications between wireless devices that may comprise the communication subsystem 200. In this regard, wireless communications may generally have limited range and it may be desirable to utilize other devices, for example, repeater devices, to extend the range of communications between wireless devices. While it may be desirable to utilize repeater devices in forwarding RF signals between wireless devices, mechanisms that prevent and/or reduce interference between receive and transmit RF signals at such repeater devices may be necessary. Accordingly, aspects of the invention may enable repeating (retransmitting) a signal at a different frequency than the frequency at which the signal was received. In this regard, a pair of frequency dividers may be utilized to generate two pairs of local oscillator signals, wherein a scaling factor of the frequency dividers may be controlled to determine the frequencies of the local oscillator signals. The first pair of local oscillator signals may be utilized to down-convert a received signal and the second pair of local oscillator signals may be utilized to up-convert the down-converted received signals. In this manner, the up-converted signal may be a frequency shifted version of the received signal and the frequency shift applied may be determined by the scaling factors of the frequency dividers.

Figure 3:
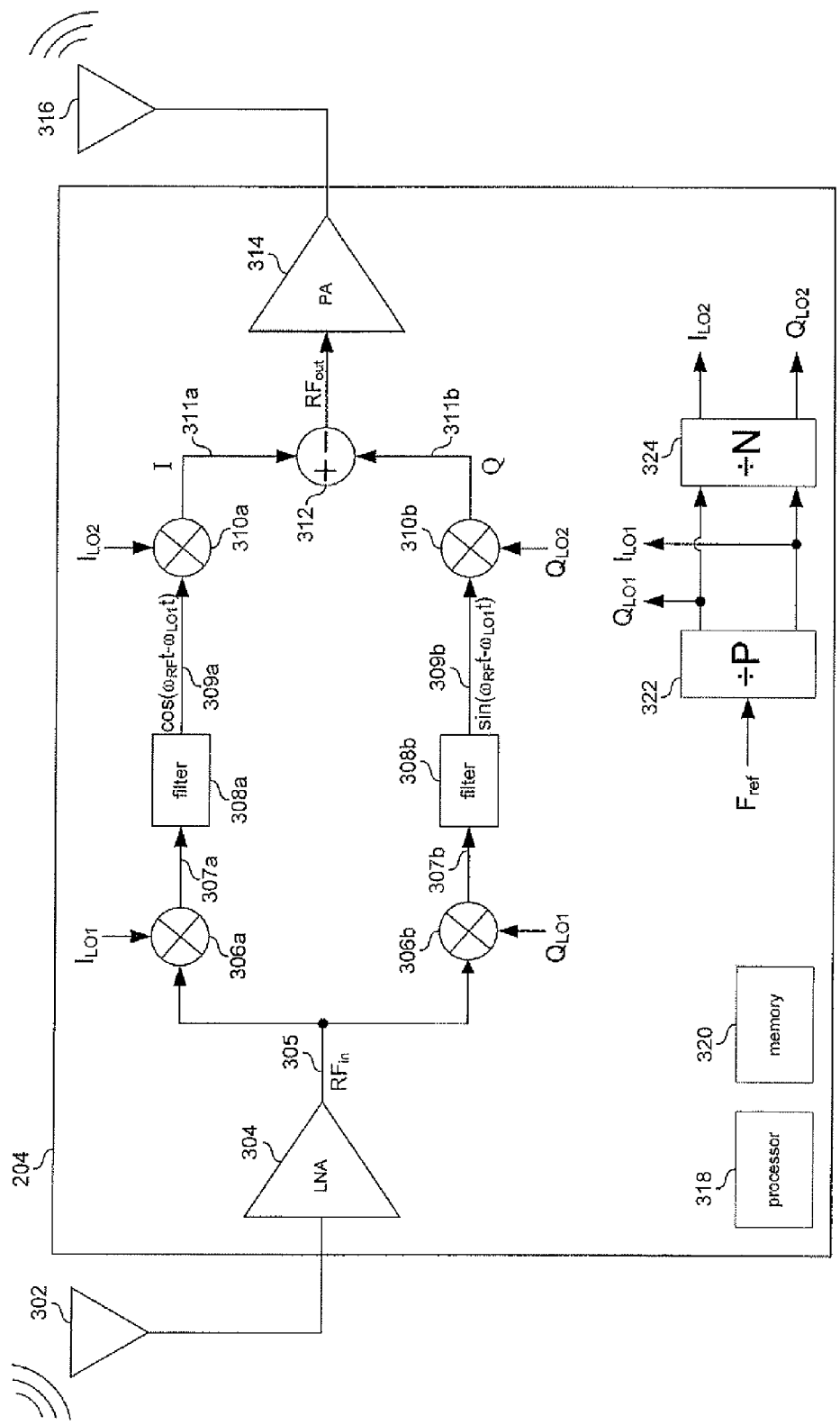
FIG. 3 is a diagram of an exemplary frequency shifting repeater, in accordance with an embodiment of the invention.

FIG. 3 is a diagram of an exemplary frequency shifting repeater, in accordance with an embodiment of the invention. Referring to FIG. 3, the repeater 104 may comprise a low noise amplifier (LNA) 304, mixers 306a, 306b, 310a, and 310b, filters 308a and 308b, adder 312, power amplifier (PA) 314, processor 318, memory 320, divide-by-P block 322, and divide-by-N block 324. The repeater 104 may comprise or be communicatively coupled to antennas 302 and 316.

The antennas 302 and 316 may be similar to, or the same as, the antennas 206a and 206b described with respect to FIG. 2.

The LNA 304 may comprise suitable logic, circuitry, and/or code that may enable buffering and/or amplification of received RF signals. In this regard, the gain of the LNA 304 may be adjustable to enable reception of signals of varying strength. Accordingly, the LNA 304 may receive one or more control signals from the processor 318 and/or the memory 320.

The mixers 306a and 306b may each comprise suitable logic, circuitry, and/or code that may enable generation of inter-modulation products resulting from mixing the received signal $RF_{IN}$ with a first in-phase LO signal $I_{LO1}$ and a first quadrature-phase LO signal $Q_{LO1}$, respectively. In various embodiments of the invention, the mixers 306a and 306b may be enabled to invert the polarity of one or both of the LO signals $I_{LO1}$ and $Q_{LO1}$ prior to mixing with the signal 305. In this regard, selecting the polarity of the local oscillator $I_{LO1}$ and $Q_{LO1}$ prior to mixing them with the signal 305. In this regard, selecting the polarity of the LO signals may enable controlling the frequency of the signal to be transmitted, $RF_{out}$.

The mixers 310a and 310b may each comprise suitable logic, circuitry, and/or code that may enable generation of inter-modulation products resulting from mixing the filter outputs 309a and 309b with a second in-phase LO signal $I_{LO2}$ and a second in-phase LO signal $Q_{LO2}$, respectively. In various embodiments of the invention, the mixers 308a and 308b may be enabled to invert the polarity of one or both of the LO signals $I_{LO2}$ and $Q_{LO2}$ prior to mixing with the signals 309. In this regard, selecting the polarity of the LO signals may enable controlling the frequencies of the signals 311 and ultimately, the frequency of the signal to be transmitted, $RF_{out}$.

The filters 308a and 308b may each comprise suitable, logic, and/or code that may enable passing frequencies at or near a desired intermediate frequency (IF) and attenuating other frequencies. In this regard, the IF may be given by $f_{305} - f_{LO1}$, where $f_{305}$ may be the frequency of the signal 305 output by the LNA 304 and $f_{LO1}$ may be the frequency of the local oscillator signals output by the divide-by-P block 322. In various embodiments of the invention, the bandwidth, attenuation, and/or center frequency of each of the filters 308a and 308b may be adjustable based on one or more control signals. Accordingly, the filters 308a and 308b may each receive one or more control signals from the processor 318 and/or the memory 320.

The adder 312 may comprise suitable logic, circuitry, and/or code for combining the signals 311a and 311b to generate an RF signal. In this regard, the adder may be enabled to add signal 311a to signal 311b, subtract signal 311a from signal 311b, and/or subtract signal 311b from signal 311a. In this regard, the adder 312 may receive one or more control signals to determine whether addition or subtraction may be performed. Furthermore, the selection of addition or subtraction may depend on the phasing and/or polarity of the signals $I_{LO1}$, $Q_{LO1}$, $I_{LO2}$, $Q_{LO2}$, 309a, and 309b.

The PA 314 may comprise suitable logic, circuitry, and/or code that may enable buffering and/or amplification of an RF signal and outputting the signal to an antenna for transmission. In this regard, the gain of the PA 314 may be adjustable and may enable transmitting signals of varying strength. Accordingly, the PA 314 may receive one or more control signals from the processor 318 and/or the memory 320.

The processor 318 may be similar to or the same as the processors 208 and/or 210 described with respect to FIG. 2. In this regard, the processor may be enabled to control operations of the repeater 104. For example, the processor 318 may provide one or more control signals for configuring the filters 308, the divide-by-P block 322, and/or the divide-by-N block 324.

The memory 320 may be similar to or the same as the memory 212 described with respect to FIG. 2. In this regard, the processor 318 may be enabled to store received data and/or information for configuring and/or operating the repeater 304. For example, the memory 320 may store information for configuring the filters 308, and/or controlling the scaling factors P and N of the blocks 322 and 324. The scaling factors P and N may each be rational number greater than 0.

The divide-by-P block 322 may comprise suitable logic, circuitry, and/or code that may enable scaling the reference frequency, $F_{ref}$, by the scaling factor P. In this regard, $F_{LO1}$, the frequency of signals $I_{LO1}$ and $Q_{LO1}$ output by the divide-by-P block 322, may be given by:

$$F_{LO1} = F_{ref}/P \qquad \text{EQ. 1}$$

where $F_{ref}$ may be generated via a VCO, PLL, direct digital frequency synthesizer (DDFS), or some other local oscillator generation circuitry. The scaling factor P may be controlled via one or more signals from the processor 318 and/or the memory 320. The scaling factor P may be controlled independent of, or in conjunction with, the scaling factor N of the divide-by-N block 324. In some embodiments of the invention, the reference frequency may be extracted and/or recovered from the received signal 305 and/or from the down-converted signal 307.

The divide-by-N block 324 may comprise suitable logic, circuitry, and/or code that may enable dividing the frequency of a signal by N. In this regard, $F_{LO2}$, the frequency of the signals $I_{LO2}$ and $Q_{LO2}$ output by the divide-by-P block 322, may be given by:

$$F_{LO2} = F_{LO1}/N \qquad \text{EQ. 1}$$

where $F_{LO1}$ is the frequency of the signals $I_{LO1}$ and $Q_{LO1}$ output by the divide-by-P block 322. The scaling factor N may be controlled via one or more signals from the processor 318 and/or the memory 320. The scaling factor N may be controlled independent of, or in conjunction with, the scaling factor P of the divide-by-P block 322

In operation, a signal may be received via the antenna 302 and amplified by the LNA 304 to generate the signal $RF_{in}$. The mixers 306a and 306b may mix $RF_{in}$ with the first LO signals $I_{LO1}$ and $Q_{LO1}$, respectively. In this regard, the processor 318 and/or the memory 320 may provide one or more signals for controlling the scaling factor P of the divide-by-P block 322 and thus controlling the frequency of $I_{LO1}$ and $Q_{LO1}$. The filters 308a and 308b may filter the output of the mixers 306a and 306b to generate intermediate frequency (IF) signals 309a and 309b. In this regard, the processor 318 and/or the memory 320 may provide one or more signals for controlling the response of the filters 308a and 308b. The mixers 308a and 308b may mix the IF signals 309a and 309b with the second LO signals $I_{LO2}$ and $Q_{LO2}$, respectively, to generate signals 311a and 311b. In this regard, the processor 318 and/or the memory 320 may provide one or more signals for controlling the scaling factor N of the divide-by-N block 324 and thus controlling the frequency of $I_{LO2}$ and $Q_{LO2}$. Additionally, the processor 318 and/or the memory 320 may provide one or more signals for controlling the polarity of the $I_{LO2}$ and $Q_{LO2}$ prior to mixing with the signals 309a and 309b.

The adder 312 may combine the signals 311a and 311b by either adding them or subtracting one from the other to generate $RF_{out}$. In this manner, $RF_{out}$ may be generated by frequency shifting $RF_{in}$ by $F_{LO1} \pm F_{LO2}$, where $F_{LO1}$ is the frequency of the LO signal output by the divide-by-P block 322 and $F_{LO2}$ is the frequency of the LO signal output by the divide-by-N block 324. In various embodiments of the invention, controlling the polarity of the LO signals and/or controlling whether the signals 311a and 311b are added or subtracted may enable controlling the frequency of the transmitted signal.

Figure 4:
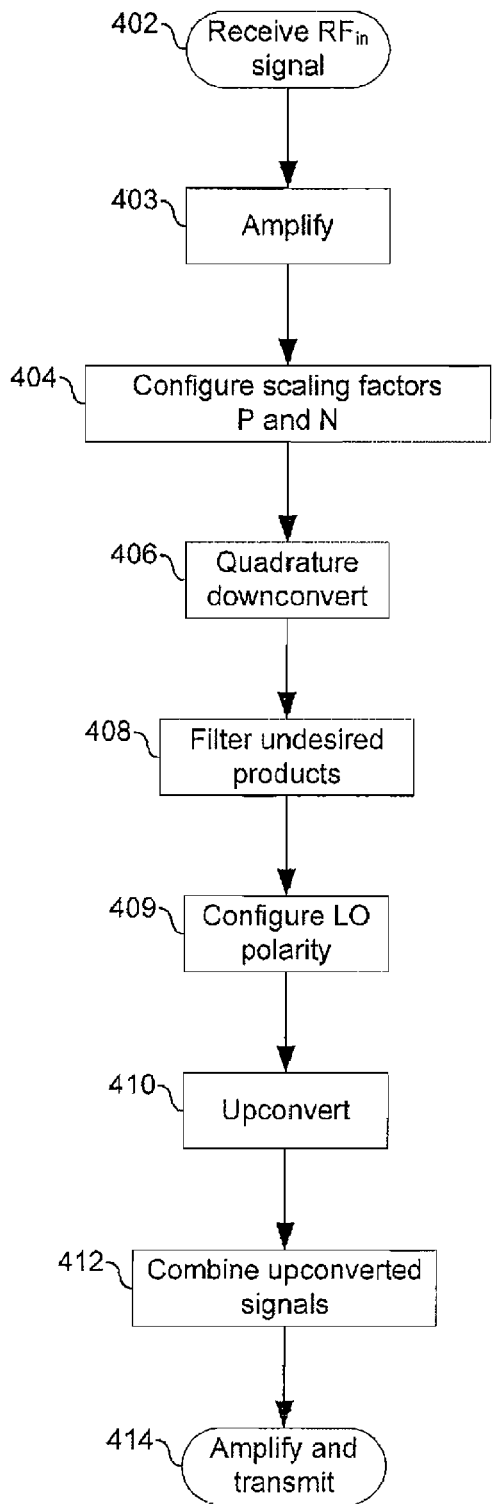
FIG. 4 is a flow chart illustrating exemplary operation of a frequency shifting repeater, in accordance with an embodiment of the invention.

FIG. 4 is a flow chart illustrating exemplary operation of a frequency shifting repeater, in accordance with an embodiment of the invention. Referring to FIG. 4 the exemplary steps may begin with step 402 when a signal may be received by the repeater 104. Subsequent to step 402, the exemplary steps may advance to step 403. In step 403, the received RF signal may be amplified by the low noise amplifier 304. Subsequent to step 403, the exemplary steps may advance to step 404.

In step 404, the scaling factors P of the divide-by-P block 322 and N of the divide-by-N block 324 may be configured. The scaling factors P and N may each be rational numbers greater than 0. The reference frequency $F_{ref}$ may be divided by the scaling factor P to generate the first pair of local oscillator signals. The frequency of the first pair of local oscillator signals may be divided by the scaling factor N to generate the second pair of local oscillator signals. The scaling factors P and N may be configured based on a frequency of a received signal $RF_{in}$, the reference frequency $F_{ref}$, and/or a desired frequency of a signal to be transmitted $RF_{out}$. The scaling factor P may determine the frequency of $I_{LO1}$ and $Q_{LO1}$. Accordingly, P may be configured such that mixing $I_{LO1}$ and $Q_{LO1}$ with the received frequency results in signals 307a and 307b having a desired frequency. Similarly, the scaling factor N may determine the frequency of $I_{LO2}$ and $Q_{LO2}$. Accordingly, N may be configured such that mixing $I_{LO2}$ and $Q_{LO2}$ with the received frequency results in signals 311a and 311b having a desired frequency. In this regard, the scaling factors P and N may be configured such that a desired frequency separation may be achieved between the received signal $RF_{in}$ and the transmitted signal $RF_{out}$. Subsequent to step 404, the exemplary steps may advance to step 406.

In step 406, the amplified RF signal 305 output by the LNA 304 may be quadrature down-converted. To down-convert the received signal, the mixer 306a may mix the signal 305 with an in-phase local oscillator signal, $I_{LO1}$, and the mixer 306b may mix the signal 305 with a quadrature-phase local oscillator signal, $Q_{LO1}$. In this manner, a pair of down-converted received signals may be generated wherein the frequency of the down-converted received signals is based at least in part on the frequency of the received signal and the frequency of the first pair of local oscillator signals $I_{LO1}$ and $I_{LO1}$. Subsequent to step 406, the exemplary steps may advance to step 408.

In step 408, the signals 307a and 307b output by the mixers 306a and 306b may be filtered to remove undesired mixer products. In this regard, the filter 308a may low pass filter the signal 307a and output $\cos(\omega_{RF} - \omega_{LO1})$ and the filter 308b may low pass filter the signal 307b and output $\sin(\omega_{RF}-\omega_{LO1})$. Subsequent to step 408, the exemplary steps may advance to step 409.

In step 409, the polarity of $I_{LO2}$ and $Q_{LO2}$ may be adjusted in order to achieve a desired transmit frequency. In this regard, controlling the polarity of $I_{LO2}$ and $Q_{LO2}$ may determine the frequency output by the adder 312. Subsequent to step 409, the exemplary steps may advance to step 410.

In step 410, the filtered signals 309a and 309b may be up-converted. In this regard, the mixer 310a may mix the signal 309a with $I_{LO2}$ and the mixer 310b may mix the signal 309b with $Q_{LO2}$. In this manner, a pair of up-converted received signals may be generated wherein the frequency of the up-converted signals is based at least in part on the frequency of the received signal, the first pair of local oscillator signals $I_{LO1}$ and $I_{LO1}$, and the frequency of the second pair of local oscillator signals $I_{LO2}$ and $I_{LO2}$. Subsequent to step 410, the exemplary steps may advance to step 412.

In step 412, the up-converted signals 311a and 311b may be combined to generate the $RF_{out}$ signal. In this regard, the signals may be added together or one of the signals 311 may be subtracted from the other. For example, the polarity of the LO signals may be adjusted (in step 409) and addition or subtraction selected such that $RF_{out}$ may be frequency shifted relative to the $RF_{in}$ signal by an amount equal to (within a tolerance) ($RF_{in}$-(LO1±LO2)). For example, if $RF_{in}$ is 61.5 GHz and the LO is 250 MHz then $RF_{out}$ may be 61 GHz. In this manner, a received signal may be repeated on a different frequency than the frequency on which it is received. In this regard, the frequency of the transmitted signal may be determined based on a desired frequency separation between the received signal and the repeated signal, or based on a frequency of operation of a target device. Subsequent to step 412, the exemplary steps may advance to step 414.

In step 414, $RF_{out}$ may be amplified by the PA 314 and transmitted via the antenna 316 to a target device such as the device 102b. In this regard, the frequency shift applied to the repeated signal may be determined based on a receive frequency of the target device.

Aspects of a method and system for frequency control in a frequency shifting repeater are provided. In an exemplary embodiment of the invention, a reference frequency $F_{REF}$ may be frequency divided to generate a first pair of local oscillator (LO) signals $I_{LO1}$ and $Q_{LO1}$, which in turn may be divided to generate a second pair of LO signals $I_{LO2}$ and $Q_{LO2}$. The two pairs of LO signals may be utilized to frequency shift a received signal 305 such that the content of the signal 305 may be repeated (retransmitted) on a different frequency as signal $RF_{out}$. The frequency shifted signal $RF_{out}$ may be generated by down-converting the received signal 305 utilizing $I_{LO1}$ and $Q_{LO1}$ to generate signals 307a and 307b. The signals 307a and 307b may be filtered to generate signals 309a and 309b, up-converting the signals 309a and 309b utilizing $I_{LO2}$ and $Q_{LO2}$, and combining the resulting up-converted signals 311a and 311b, to generate the frequency shifted received signal $RF_{out}$.

The reference frequency $F_{REF}$ may be recovered from the received signal 305. $F_{REF}$ may be divided by a first scaling factor P to generate $I_{LO1}$ and $Q_{LO1}$. $I_{LO1}$ and $Q_{LO1}$ may be divided by a second scaling factor N to generate $I_{LO2}$ and $Q_{LO2}$. The two scaling factors P and N may be controlled independently of, or in conjunction with, each other. One or both of the scaling factors P and N may be controlled based on a desired frequency separation between $RF_{in}$ and $RF_{out}$. The polarity of $I_{LO2}$ and $Q_{LO2}$ may be adjusted prior to utilizing them to up-convert the signals 309a and 309b. The down-converted received signals 309a and 309b may be generated by mixing, via the mixers 306a and 306b, the received signal 305 with $I_{LO1}$ and $Q_{LO1}$, and filtering the resulting signals via the filters 308a and 308b. The up-converted signals 311a and 311b may be generated by mixing, via the mixers 308a and 308b, the down-converted received signals 309a and 309b with $I_{LO2}$ and $Q_{LO2}$.

Another embodiment of the invention may provide a machine-readable storage, having stored thereon, a computer program having at least one code section executable by a machine, thereby causing the machine to perform the steps as described herein for communicating via a frequency shifting repeater.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A frequency shifting repeater comprising:
one or more circuits operable to at least:
generate a first scaling factor and a second scaling factor;
divide a reference frequency to obtain a first in-phase signal and a first quadrature-phase signal by using said first scaling factor;
divide said first in-phase signal and said first quadrature-phase signal to obtain respectively a second in-phase signal and a second quadrature-phase signal by using said second scaling factor;
utilize said first in-phase signal, said first quadrature-phase signal, said second in-phase signal, and said second quadrature-phase signal to operate down-converting mixers and up-converting mixers to generate a frequency shifted signal corresponding to a received signal at an input of said frequency shifting repeater.

2. The frequency shifting repeater of claim 1, wherein said one or more circuits are operable to generate said first scaling factor independently of said second scaling factor.

3. The frequency shifting repeater of claim 1, wherein said one or more circuits are operable to generate said first scaling factor and said second scaling factor based on one or more frequencies on which one or more of a plurality of target devices receives signals.

4. The frequency shifting repeater of claim 1, wherein a processor in said frequency shifting repeater generates said first scaling factor.

5. The frequency shifting repeater of claim 1, wherein a processor in said frequency shifting repeater generates said second scaling factor.

6. The frequency shifting repeater of claim 1, wherein a memory in said frequency shifting repeater generates said first scaling factor.

7. The frequency shifting repeater of claim 1, wherein a memory in said frequency shifting repeater generates said second scaling factor.

8. The frequency shifting repeater of claim 1, wherein said one or more circuits are operable to generate one or both of said first scaling factor and said second scaling factor based on a desired frequency separation between said received signal and said frequency shifted signal.

9. The frequency shifting repeater of claim 1, wherein said one or more circuits are operable to adjust a polarity of said second in-phase signal and said second quadrature-phase signal.

10. The frequency shifting repeater of claim 1, wherein said one or more circuits are operate to generate said reference frequency.

11. A method for use in a frequency shifting repeater, said method comprising:
generating a first scaling factor and a second scaling factor;
dividing said reference frequency to obtain a first in-phase signal and a first quadrature-phase signal by using said first scaling factor;
dividing said first in-phase signal and said first quadrature-phase signal to obtain respectively a second in-phase signal and a second quadrature-phase signal by using said second scaling factor;
utilizing said first in-phase signal, said first quadrature-phase signal, said second in-phase signal, and said second quadrature-phase signal to operate down-converting mixers and up-converting mixers to generate a frequency shifted signal corresponding to a received signal at an input of said frequency shifting repeater.

12. The method of claim 11 further comprising generating said first scaling factor independently of said second scaling factor.

13. The method of claim 11 further comprising generating said first scaling factor and said second scaling factor based on one or more frequencies on which one or more of a plurality of target devices receives signals.

14. The method of claim 11 further comprising using a processor in said frequency shifting repeater to generate said first scaling factor.

15. The method of claim 11 further comprising using a processor in said frequency shifting repeater to generate said second scaling factor.

16. The method of claim 11 further comprising using a memory in said frequency shifting repeater to generate said first scaling factor.

17. The method of claim 11 further comprising using a memory in said frequency shifting repeater to generate said second scaling factor.

18. The method of claim 11 further comprising generating one or both of said first scaling factor and said second scaling factor based on a desired frequency separation between said received signal and said frequency shifted signal.

19. The method of claim 11 further comprising adjusting a polarity of said second in-phase signal and said second quadrature-phase signal.

20. The method of claim 11 further comprising generating said reference frequency in said frequency shifting repeater.

* * * * *